United States Patent
Kang et al.

(10) Patent No.: US 6,615,382 B1
(45) Date of Patent: Sep. 2, 2003

(54) METHOD FOR CONTROLLING ERRORS IN LINK LAYER IN WIDEBAND WIRELESS COMMUNICATION AND COMPUTER READABLE MEDIA THEREFOR

(75) Inventors: Woo-shik Kang, Suwon (KR); Kyung Hun Jang, Seoul (KR); Chung-gu Kang, Seoul (KR); Chang-wook Ahn, Kwangyeok (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 418 days.

(21) Appl. No.: 09/648,743

(22) Filed: Aug. 28, 2000

(30) Foreign Application Priority Data

Aug. 27, 1999 (KR) ........................................ 1999-35839

(51) Int. Cl.$^7$ ............................................... H04L 1/08
(52) U.S. Cl. ..................................................... 714/748
(58) Field of Search ................................ 714/748–749, 714/751, 820–821

(56) References Cited

U.S. PATENT DOCUMENTS

| | | | | |
|---|---|---|---|---|
| 5,533,004 A | | 7/1996 | Jasper et al. ................... | 370/11 |
| 5,717,689 A | * | 2/1998 | Ayanoglu ..................... | 714/749 |
| 6,084,888 A | * | 7/2000 | Watanabe et al. ............ | 370/473 |
| 2002/0027897 A1 | * | 3/2002 | Mousley et al. ............ | 370/342 |

FOREIGN PATENT DOCUMENTS

| | | |
|---|---|---|
| EP | 0 197 545 A2 | 10/1986 |
| EP | 0 350 238 A2 | 1/1990 |
| EP | 0 606 016 A1 | 7/1994 ............. H04L/1/12 |

(List continued on next page.)

OTHER PUBLICATIONS

IEEE Transactions on Communications; A. Annamalai et al.; "Analysis and Optimization of Adaptive Multicopy Transmission ARQ Protocols for Time–Varying Channels"; vol. 46.; No. 10; Oct. 1998 (New York); pp. 1356–1368.

(List continued on next page.)

*Primary Examiner*—R. Stephen Dildine
(74) *Attorney, Agent, or Firm*—Sughrue Mion, PLLC

(57) ABSTRACT

A method for controlling errors in a wireless link layer using a simultaneous multiple copy scheme and an adaptive forward error correction (FEC) scheme in a wideband wireless communication is provided. The method for controlling errors in a link layer in wideband wireless communication using an automatic repeat request (ARQ) scheme, in which a wideband wireless channel is used for communication between a first node and a second node, includes the steps of (a) estimating the error ratio of a forward (a direction in which a cell is transmitted from the first node to the second node) channel using the state of a backward (a direction in which a cell is transmitted from the second node to the first node) channel, and transmitting a cell, in which a forward error correction (FEC) code having an encoding ratio that varies depending on the estimated error ratio is included in a protocol data unit (PDU) of a wireless link layer, through the forward channel and (b) re-transmitting the copy of a cell transmitted in the step (a), when feedback information that indicates that an error exists in the cell transmitted in the step (a) is received through the backward channel. It is possible to reduce the number of times of re-transmission by improving the probability of correcting forward errors using more error controlling bits as the state of the channel is worse and to minimize the waste of resources using less error controlling bits as the state of the channel is better, to thus obtain the optimal performance and guarantee the minimum delay time.

37 Claims, 8 Drawing Sheets

FOREIGN PATENT DOCUMENTS

Figure 1:
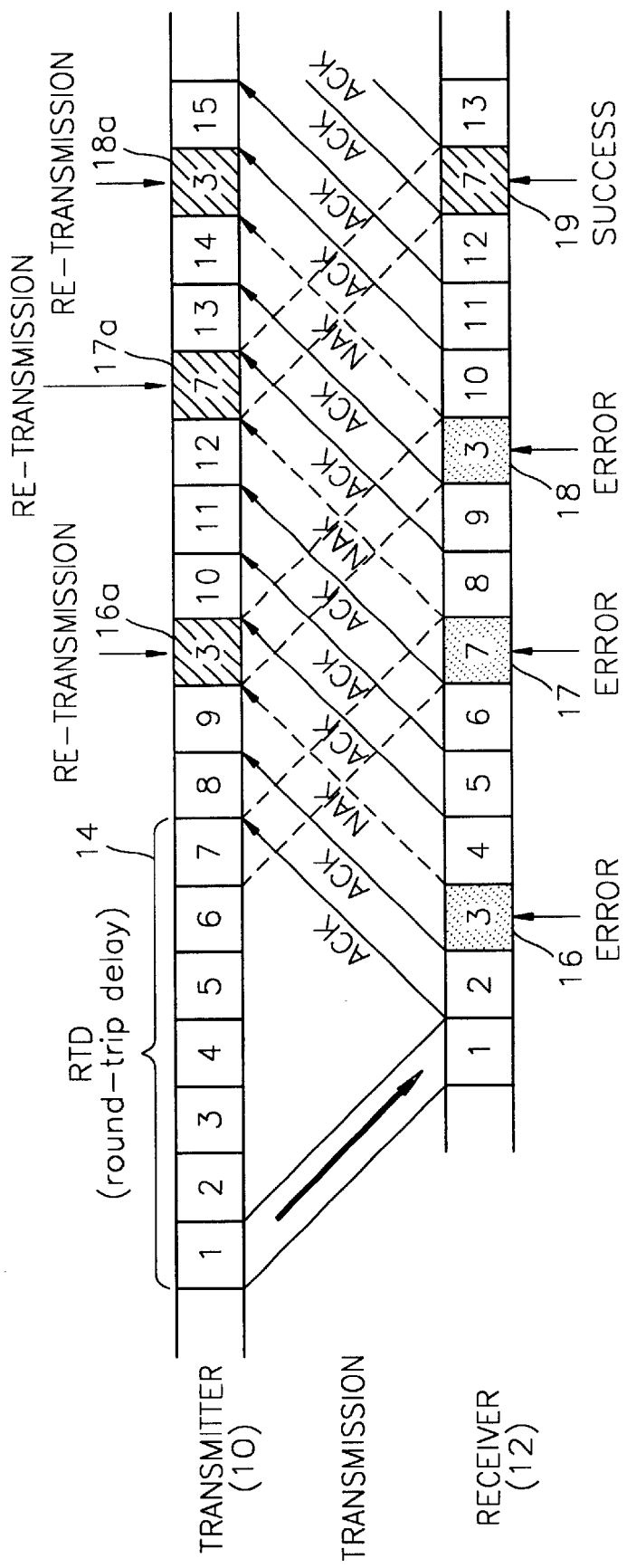

| | | | |
|---|---|---|---|
| EP | 0 768 806 A2 | 4/1997 | ........... H04Q/11/04 |
| EP | 0 996 248 A1 | 4/2000 | |
| GB | 2 253 546 A | 9/1992 | ............. H04L/1/20 |
| JP | 3-289731 | 12/1991 | |
| JP | 6-268572 | 9/1994 | |
| JP | 7-30543 | 1/1995 | |
| JP | 7-193514 | 7/1995 | |
| JP | 7-202856 | 8/1995 | |
| JP | 7-327026 | 12/1995 | |
| JP | 9-51337 | 2/1997 | |
| JP | 10-173600 | 6/1998 | |
| JP | 10-247942 | 9/1998 | |
| WO | WO 99/12303 A1 | 3/1999 | |
| WO | WO 9912303 A1 * | 3/1999 | ............. H04L/1/12 |
| WO | 99/12303 | 3/1999 | ............. H04L/1/12 |
| WO | 99/49610 | 9/1999 | ............. H04L/1/12 |
| WO | WO 00/52873 A2 | 9/2000 | |
| WO | WO 0052873 A2 * | 9/2000 | ............. H04L/1/18 |

OTHER PUBLICATIONS

IEEE International Symposium on Personal, Indoor and Mobile Radio Communications; A R Prasad et al.; "Performance Analysis of a Hybrid ARQ for IP Packet Transmission in Fading Channel"; published 1998; pp. 111–115.

IEEE International Conference on Communications; H M De Lima et al.; "A Go–Back–N Protocol with Multicopy Retransmission for High Speed Satellite Communications"; published 1994; pp. 859–863.

IEEE Transactions on Communications; A C Martins et al.; "ARQ Protocols with Adaptive Block Size Perform Better Over a Wide Range of Bit Error Rates"; vol. 38; No. 6; Jun. 1990; pp. 737–739.

Performance Evaluation for Error Control Scheme in Wireless ATM Networks, Takayuki Nakao, Miki Yamamoto, Hiromi Okada and Hiromasa Ikeda, pp. 29–35.

* cited by examiner

METHOD FOR CONTROLLING ERRORS IN LINK LAYER IN WIDEBAND WIRELESS COMMUNICATION AND COMPUTER READABLE MEDIA THEREFOR

BACKGROUND OF THE INVENTION

1. Field of the Invention

The present invention relates to a method for controlling errors in a link layer during wideband wireless communication, and more particularly, to a method for controlling the errors in a wireless link layer using a simultaneous multiple copy scheme and an adaptive forward error control scheme for a real time service during wideband wireless communication. The present application is based on Korean Application No. 99-35839.

2. Description of the Related Art

In wideband communication using an optical cable, transmission error ratio is very low due to the stability of communication media. However, in the case of wireless communication, the transmission error ratio is higher than in communication through wire and the distribution of the error ratio is very variable, due to the characteristics of media. Therefore, the error controlling scheme is very important to wideband wireless communication.

The error controlling scheme in the conventional wireless link layer is classified into a forward error correction (FEC) scheme for correcting errors in a wireless channel, an automatic repeat request (ARQ) scheme for performing re-transmission when errors are detected in received data, and a hybrid ARQ scheme where the above two methods are combined with each other. The ARQ scheme will be described first.

FIG. 1 schematically shows processes of controlling errors in the link layer by the conventional ARQ method. In general, the ARQ scheme or a sliding window method is used for controlling the errors in the link layer. There are various types of ARQ schemes. Here, a selective repeat method, which is a representative ARQ scheme, will be described.

As shown in FIG. 1, a receiver 12 feeds back an acknowledgment (ACK) to a transmitter 10 when each cell (the transmission unit of the link layer) transmitted by the transmitter 10 is successfully received and feeds back a negative acknowledgment (NAK), which indicates that a cell has been corrupted, when a cell transmitted by the transmitter 10 is not successfully received. A time delay taken to receive the ACK or the NAK from the receiver 12 after the transmitter 10 transmits the cell is defined as a round trip delay (RTD) 14. The receiver 12 generally uses a checksum in order to determine that a cell has been corrupted. A cyclic redundancy code (CRC) is used for the representative method for calculating the checksum.

In FIG. 1, the receiver 12 finds error in a third cell 16 and feeds back the NAK with respect to the corresponding cell to the transmitter 10. After the RTD, the transmitter 10 which received the NAK re-transmits "one" copy 16a of the third cell 16 to the receiver 12. Also, a corresponding cell 17a is re-transmitted with respect to a seventh cell 17 in which an error occurs. As a result, it is noted that a corresponding cell 19 is successfully received by the receiver 12.

However, errors may occur in the re-transmitted cells 16a and 18. In this case, the receiver 12 feeds back the NAK and the transmitter 10 re-transmits the corresponding cell 18a.

In the FEC scheme, when the receiver finds an error in a cell, the receiver does not request the transmitter to re-transmit the cell, but recovers or corrects the cell. However, severe overhead is caused by encoding all information required for recovering the error and inserting the encoded information in a transmitted cell. It is difficult to apply the FEC scheme as the size of the cell increases. Therefore, a hybrid ARQ scheme, which first recovers or corrects a certain number of errors by the FEC and then determines whether an error exists by the CRC is generally used, instead of the pure FEC scheme.

Figure 2:
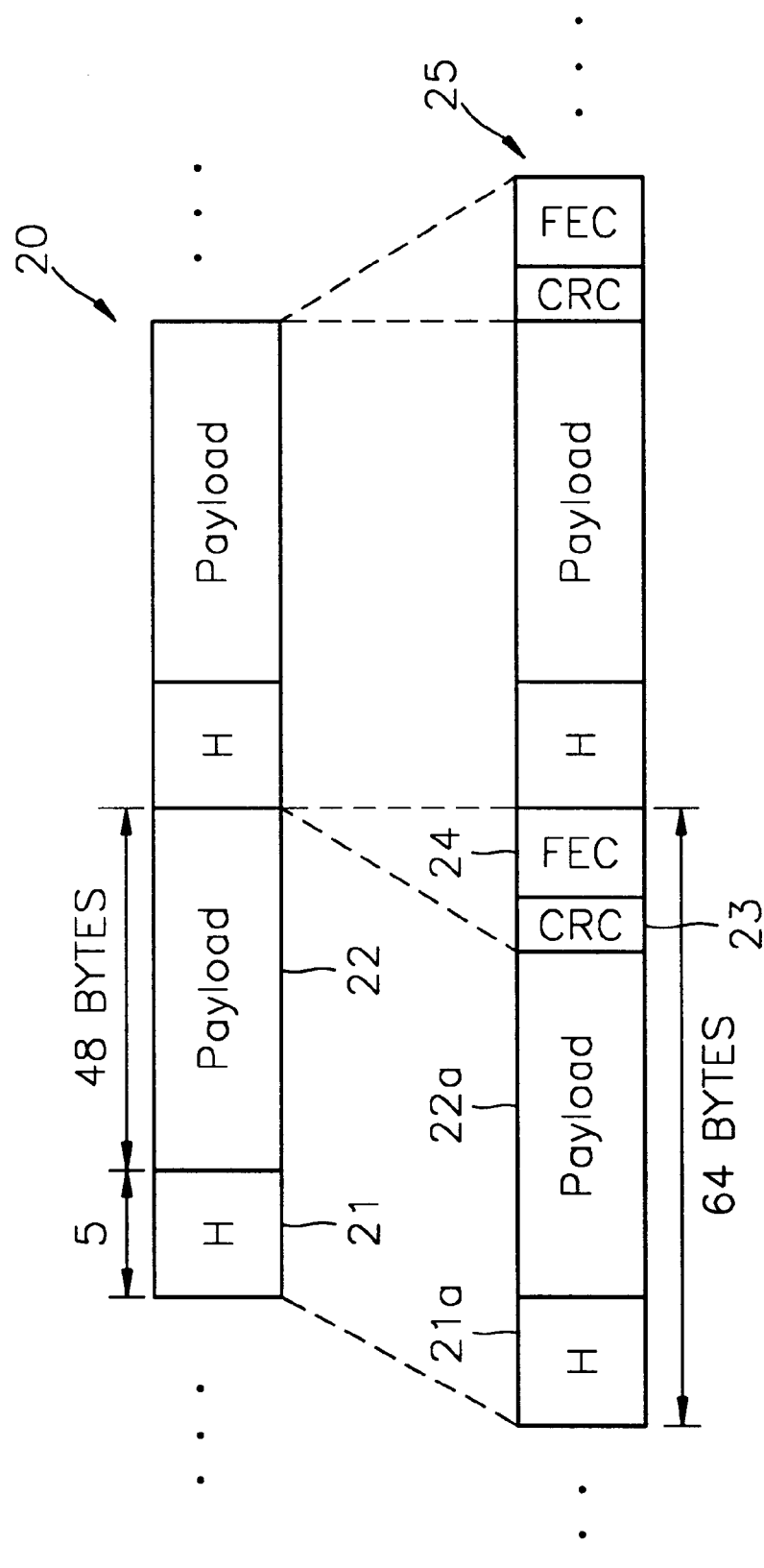

FIG. 2 schematically shows the structure of a wireless cell according to the conventional hybrid ARQ scheme. The cell received through wire (a wire ATM cell), which is a protocol data unit (PDU) 20 of an upper layer, is encapsulated to a PDU 25 of the link layer for the wireless channel and then transmitted. Here, an asynchronous transfer mode (ATM) cell will be described.

A wire ATM cell 20, including a header 21 of 5 bytes and a payload 22 of 48 bytes, has a fixed length of 53 bytes. The header 21 and the payload 22 of the wire ATM cell 20 are converged as they are to a header 21a and a payload 22a of the PDU of a wireless data link control layer (wireless DLC-PDU), and then the CRC 23 and the FEC 24 in order to control the error in the wireless channel are added for constituting the wireless DLC-PDU. Here, it is assumed that the wireless ATM DLC-PDU has a fixed length of 64 bytes, as proposed currently. Therefore, when it is assumed that the length of the CRC is 2 bytes, the length of the FEC is fixed to 9 bytes. Namely, a fixed encoding ratio is used regardless of the state of a channel.

Since a time delay corresponding to at least the RTD is required for the transmitter 10 to be informed of the error in the cell transmitted by the transmitter 10 from the receiver 12 and to re-transmit the cell to the receiver 12, the number of times of the re-transmission is extremely restricted in a real time service. However, resources can be wasted without successful transmission of a cell if only one copy of a cell containing errors is re-transmitted to provide an opportunity to correct the errors. This is because the conventional method related to the ARQ error control scheme is mainly used for a non-real time service.

Since a uniform encoding ratio is used regardless of the state of a channel in the conventional hybrid ARQ scheme, the efficiency of resources may be deteriorated in a case where the conventional hybrid ARQ scheme is used in the wireless channel in which the state of the channel changes relatively often.

SUMMARY OF THE INVENTION

To solve the above problems, it is an object of the present invention to provide a method for controlling errors in a link layer using a simultaneous multiple copy scheme and an adaptive forward error control scheme, which is capable of satisfying quality of service (QOS) such as a cell propagation delay time and a cell loss ratio (CLR) for a real-time service as well as a non-real time service in a wideband wireless communication.

It is another object of the present invention to provide recording media therefor.

Accordingly, to achieve the first object, according to an aspect of the present invention, there is provided a method for controlling errors in a link layer in wideband wireless communication using an automatic repeat request (ARQ) scheme, in which a wideband wireless channel is used for communication between a first node and a second node, comprising the steps of (a) estimating the error ratio of a forward (a direction in which a cell is transmitted from the first node to the second node) channel using the state of a backward (a direction in which a cell is transmitted from the second node to the first node) channel, and transmitting a cell, in which a forward error correction (FEC) code having an encoding ratio that varies depending on the estimated error ratio is included in a protocol data unit (PDU) of a wireless link layer, through the forward channel and (b) re-transmitting the copy of a cell transmitted in the step (a), when feedback information that indicates that an error exists in the cell transmitted in the step (a) is received through the backward channel.

The PDU of the wireless link layer in the step (a) preferably has a fixed length regardless of the variable encoding ratio of the FEC code.

In the step (b), a plurality of copies of the cell to be transmitted in the step (a) are preferably re-transmitted using a simultaneous multiple copy method in the same frame.

According to another aspect of the present invention, there is provided a method for controlling errors in a link layer in wideband wireless communication using an ARQ scheme, in which a wideband wireless channel is used for communication between a first node and a second node, comprising the steps of (a) estimating the error ratio of a forward (a direction in which a cell is transmitted from the first node to the second node) channel through the state of a backward (a direction in which a cell is transmitted from the second node to the first node) channel, (b) determining a ratio in which the PDU of an upper layer is converged to the PDU of a wireless link layer on the basis of the error ratio of the forward channel estimated in the step (a), (c) transmitting the cell of the PDU of the wireless link layer formed according to the convergence ratio determined in the step (b) through the forward channel, and (d) re-transmitting the copy of the cell transmitted in the step (c) when feed-back information which indicates that an error exists in the cell transmitted in the step (c) is received through the backward channel.

The step (a) preferably comprises the steps of (a1) receiving a cell through the backward channel, (a2) determining whether an error exists in the cell received in the step (a1), and (a3) calculating the ratio of the number of cells determined to have errors in the step (a2) to the number of cells received in the step (a1) during a predetermined time period, and estimating the ratio as the error ratio of the forward channel.

In the step (b), when N and M are first and second positive integers and N is smaller than M, the convergence ratio is preferably determined to be 1:1 when the error ratio estimated in the step (a) is less than a predetermined threshold value and the convergence ratio is preferably determined to be N:M when the error ratio estimated in the step (a) is equal to or more than the predetermined threshold value.

According to another aspect of the present invention, there is provided a method for controlling errors in a link layer in wideband wireless communication using an ARQ scheme, in which a wideband wireless channel is used for communication between a first node and a second node, comprising the steps of (a) estimating the error ratio of a forward (a direction in which a cell is transmitted from the first node to the second node) channel through the state of a backward (a direction in which the cell is transmitted from the second node to the first node) channel and determining the ratio in which the payload of the PDU of an upper layer is converged to the payload of the PDU of a wireless link layer on the basis of the estimated error ratio, (b) forming a cell to be transmitted through the forward channel by converging the header of the PDU of the upper layer to the header of the PDU of the wireless link layer, adding a checksum and a FEC code with respect to the header, converging the payload of the PDU of the upper layer to the payload of the PDU of the wireless link layer according to the convergence ratio determined in the step (a), and adding a checksum and the FEC code with respect to the payload, (c) transmitting the cell formed in the step (b) through the forward channel, and (d) re-transmitting the copy of the cell transmitted in the step (c) when feedback information which indicates that an error exists in the cell transmitted in the step (c) is received through the backward channel.

According to another aspect of the present invention, there is provided a method for controlling errors in a link layer in wideband wireless communication using an ARQ scheme, in which a wideband wireless channel is used for communication between a first node and a second node, comprising the steps of (a) partitioning the error ratio of the wideband wireless channel into a plurality of sections and estimating the error ratio of a forward (a direction in which a cell is transmitted from the first node to the second node) channel to belong to one of the plurality of predetermined sections through the state of a backward (a direction in which the cell is transmitted from the first node to the second node) channel, (b) determining the convergence ratio in which the payload of the PDU of an upper layer is converged to the payload of the PDU of a wireless link layer on the basis of the error ratio of the forward channel estimated to belong to one of the plurality of sections in the step (a) and forming a cell according to the convergence ratio, to be transmitted through the forward channel, (c) newly adjusting allocated bandwidth when the convergence ratio determined in the step (b) changes due to the change of the section to which the error ratio estimated in the step (a) belongs, (d) transmitting the cell formed in the step (b) through the forward channel, and (e) re-transmitting the copy of the cell transmitted in the step (d) when feedback information which indicates that an error exists in the cell transmitted in the step (d) is received through the backward channel.

According to another aspect of the present invention, there is provided a method for controlling errors in a link layer in wideband wireless communication using an ARQ scheme, in which a wideband wireless channel is used for communication between a first node and a second node, comprising the steps of (a) estimating the error ratio of a forward (a direction in which a cell is transmitted from the first node to the second node) channel through the state of a backward (a direction in which the cell is transmitted from the second node to the first node) channel and determining the ratio in which the PDU of an upper layer is converged to the PDU of a wireless link layer on the basis of the estimated error ratio, (b) transmitting the cell of the PDU of the wireless link layer formed according to the convergence ratio determined in the step (a) through the forward channel, (c) receiving feedback information on the cell transmitted in the step (b) through the backward channel, and (d) re-transmitting a plurality of copies of the cell transmitted in the step (b) when feedback information that indicates that an error exists in the cell transmitted in the step (b) is received in the step (c).

In the step (d), a plurality of copies of the cell transmitted in the step (b) are preferably re-transmitted in the same frame using a simultaneous multiple copy method.

According to another aspect of the present invention, there is provided a method for controlling errors in a link layer in wideband wireless communication using an ARQ scheme, in which a wideband wireless channel is used for communication between a first node and a second node, comprising the steps of (a) estimating the error ratio of a forward (a direction in which a cell is transmitted from the first node to the second node) channel through the state of a backward (a direction in which a cell is transmitted from the second node to the first node) channel and determining the ratio in which the PDU of an upper layer is converged to the PDU of a wireless layer on the basis of the estimated error ratio, (b) transmitting the cell of the PDU of the wireless link layer, which is formed according to the convergence ratio determined in the step (a) through the forward channel, (c) receiving feedback information on the cell transmitted in the step (b) through the backward channel, (d) newly adjusting additional bandwidth required for re-transmitting a plurality of copies of the cell transmitted in the step (b) in the same frame using a simultaneous multiple copy method when feedback information that indicates that an error exists in the cell transmitted in the step (b) is received in the step (c), and (e) re-transmitting a plurality of copies of the cell transmitted in the step (b) in the same frame using a simultaneous multiple copy method.

According to another aspect of the present invention, there is provided a method for controlling errors in a link layer in a wideband wireless communication using an ARQ scheme, in which a wideband wireless channel is used for communication between nodes, comprising the steps of (a) forming a cell by converging the PDU of an upper layer to the PDU of a wireless link layer, (b) transmitting the cell constituted in the step (a), (c) receiving feedback information on the cell transmitted in the step (b), and (d) re-transmitting a plurality of copies of the cell transmitted in the step (b) in the same frame using a simultaneous multiple copy method when feedback information that indicates that an error exists in the cell transmitted in the step (b) is received in the step (c).

To achieve the second object, according to an aspect of the present invention, there is provided computer readable recording media in which programs for executing the steps of (a) estimating an error ratio of a forward (a direction in which a cell is transmitted from the first node to the second node) channel through the state of a backward (a direction in which a cell is transmitted from the second node to the first node) channel and transmitting a cell, in which a FEC code having a variable encoding ratio according to the estimated error ratio is included in the PDU of a wireless link layer, through the forward channel and (b) re-transmitting the copy of the cell transmitted in the step (a) when feedback information which indicates that an error exists in the cell transmitted in the step (a) is received through the backward channel, by computers, are recorded, in wideband wireless communication for controlling errors in a link layer using an ARQ scheme, in which a wideband wireless channel is used for communication between a first node and a second node.

According to another aspect of the present invention, there is provided computer readable recording media in which programs for executing the steps of (a) estimating the error ratio of a forward (a direction in which a cell is transmitted from the second node to the first node) channel through the state of a backward (a direction in which a cell is transmitted from the second node to the first node) channel, (b) determining a ratio to which the PDU of an upper layer is converged to the PDU of a wireless link layer, on the basis of the error ratio of the forward channel estimated in the step (a), (c) forming a cell to be transmitted through the forward channel by converging the PDU of the upper layer to the PDU of the wireless link layer according to the convergence ratio determined in the step (b), (d) transmitting the cell formed in the step (c) through the forward channel, (e) receiving feedback information on the cell transmitted in the step (d) through the backward channel, and (f) re-transmitting the plurality of copies of the cell transmitted in the step (d) using a simultaneous multiple copy method in the same frame when feedback information that indicates that an error exists in the cell transmitted in the step (d) is received in the step (e), by computers, are recorded, in wideband wireless communication for controlling errors in a link layer using an ARQ scheme, in which a wideband wireless channel is used for communication between a first node and a second node.

BRIEF DESCRIPTION OF THE DRAWING(S)

Figure 3:
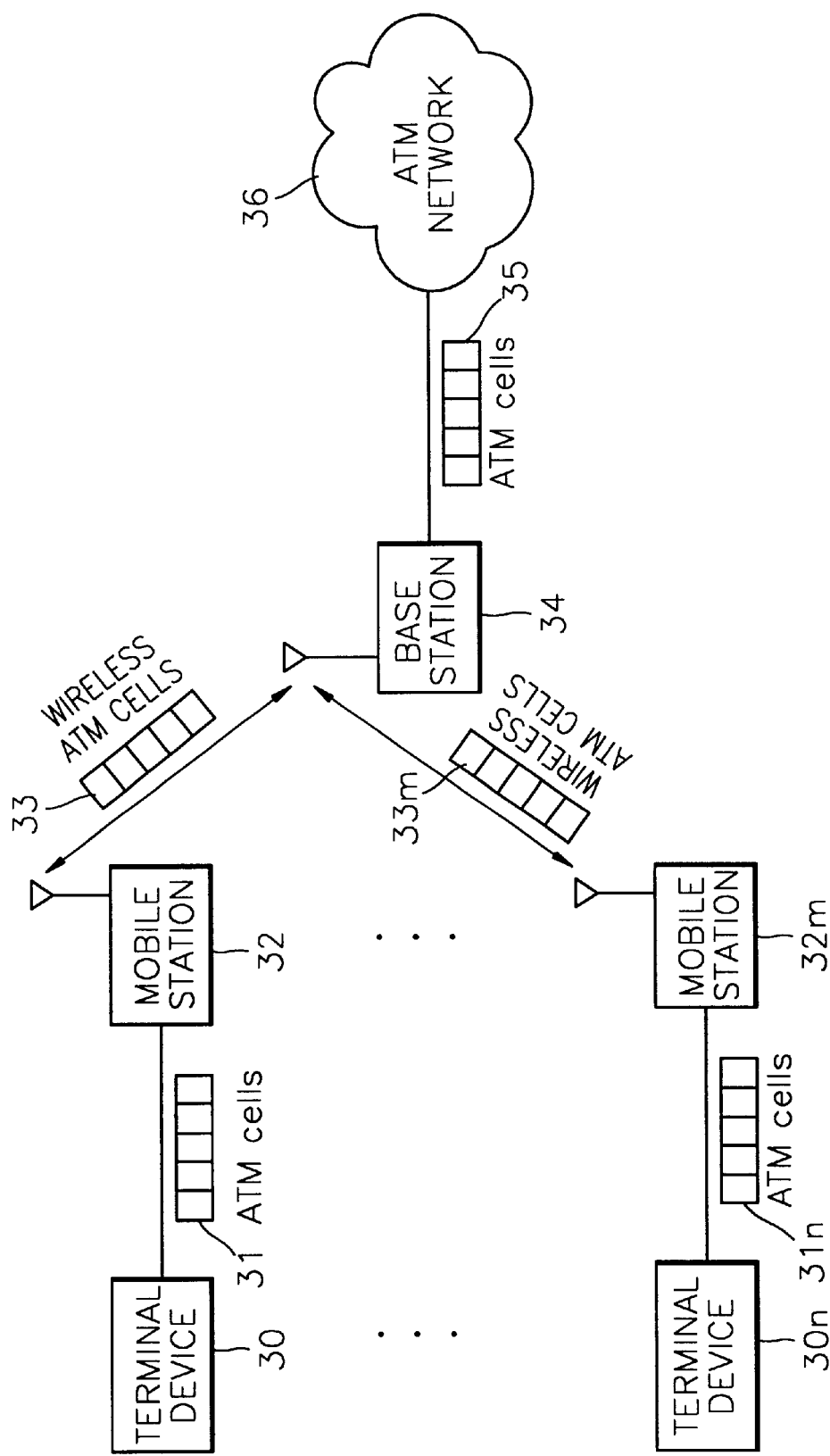
Figure 4:
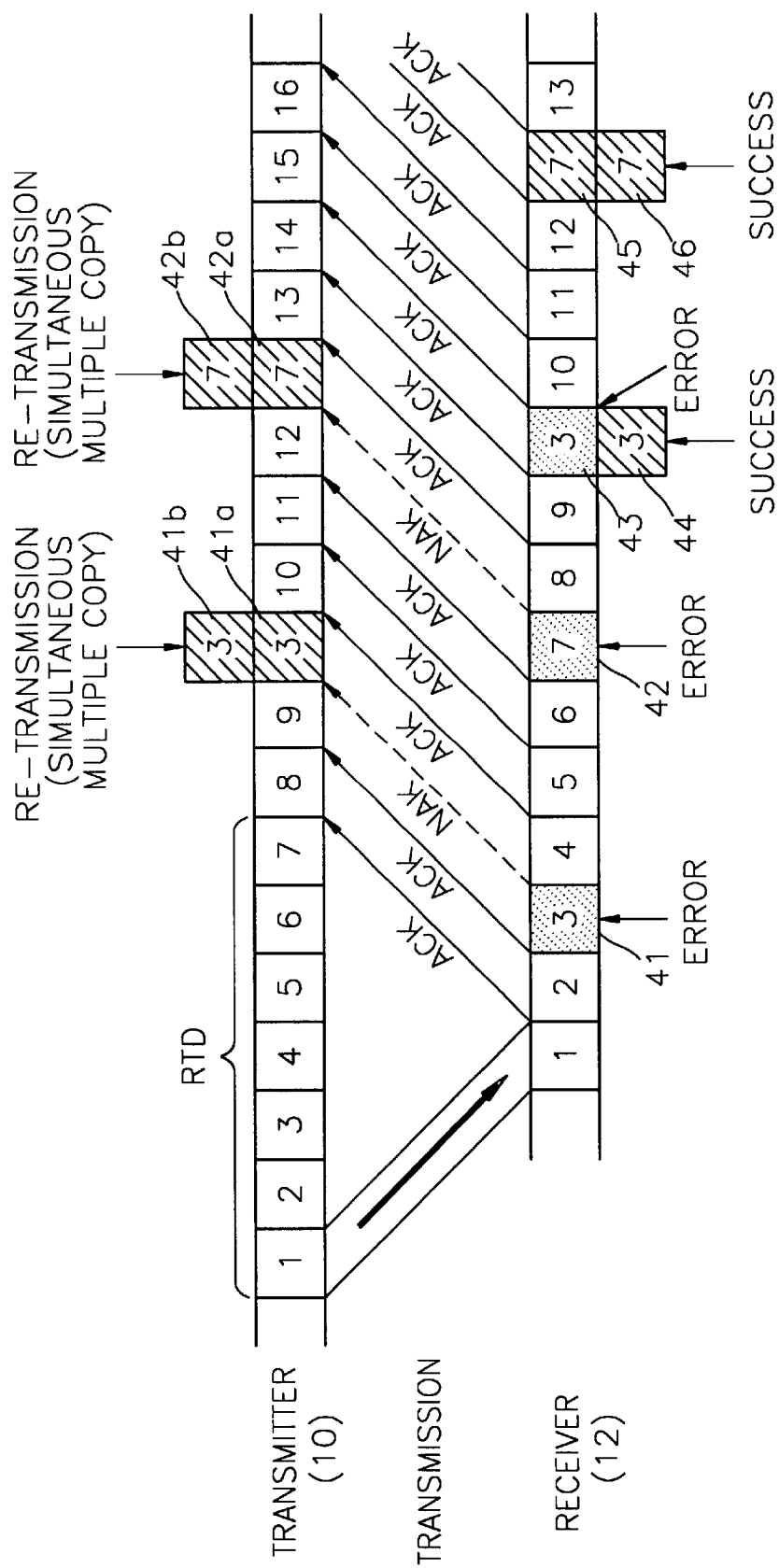
Figure 5:
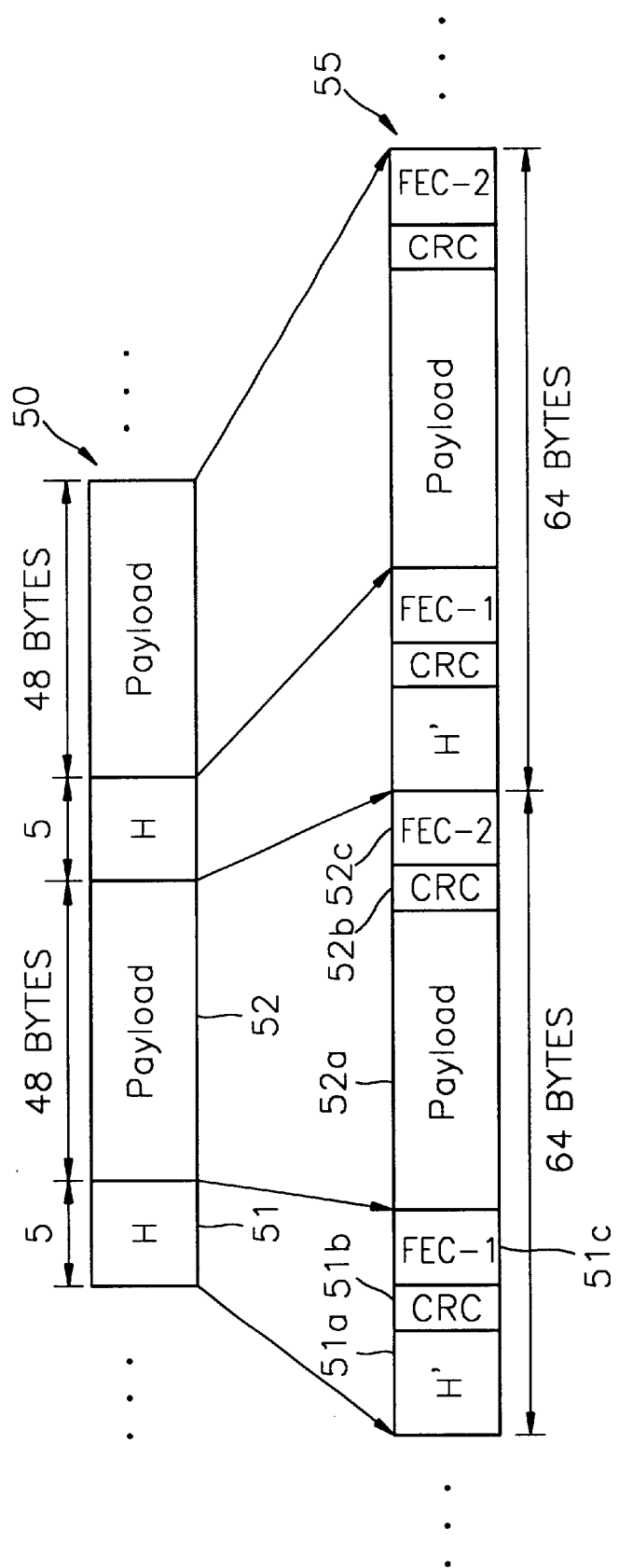
Figure 6:
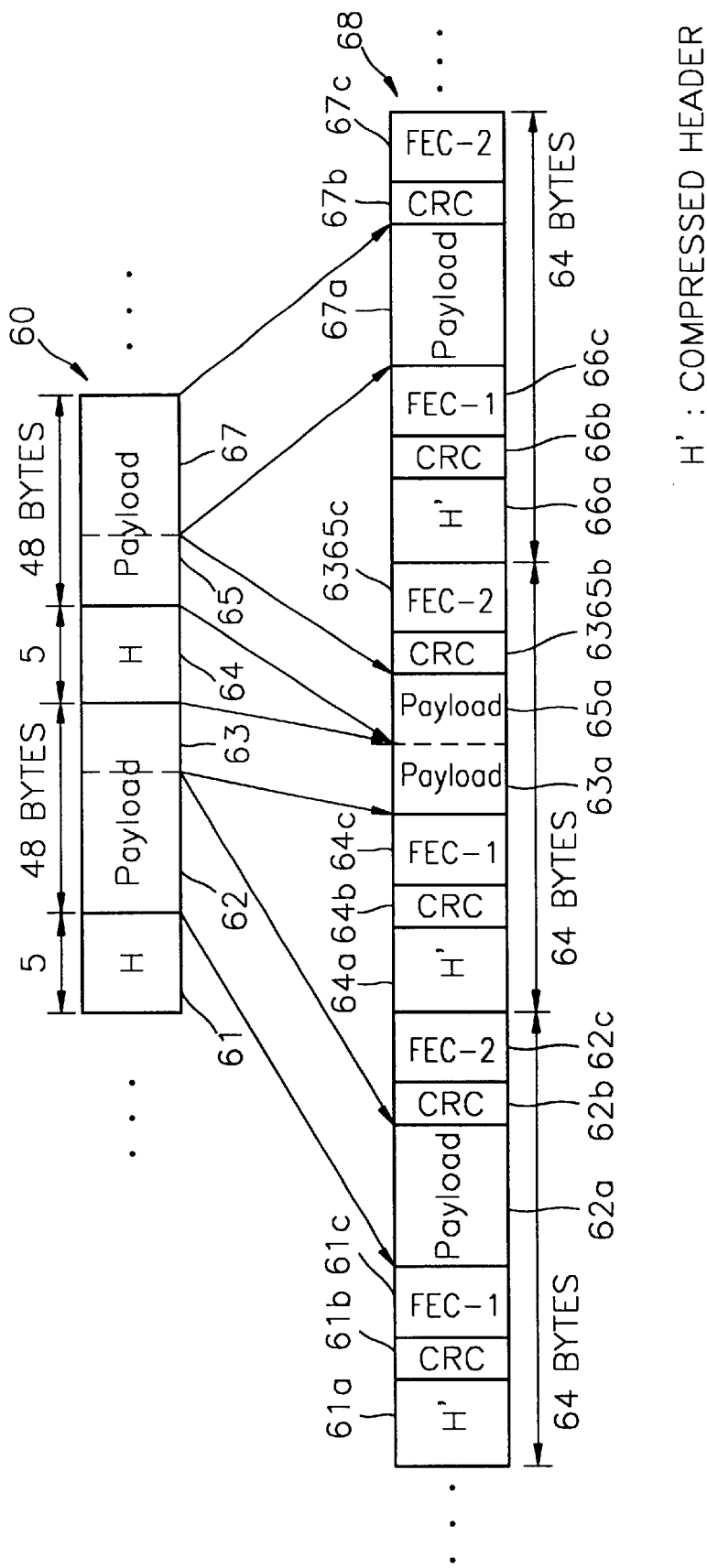
Figure 7:
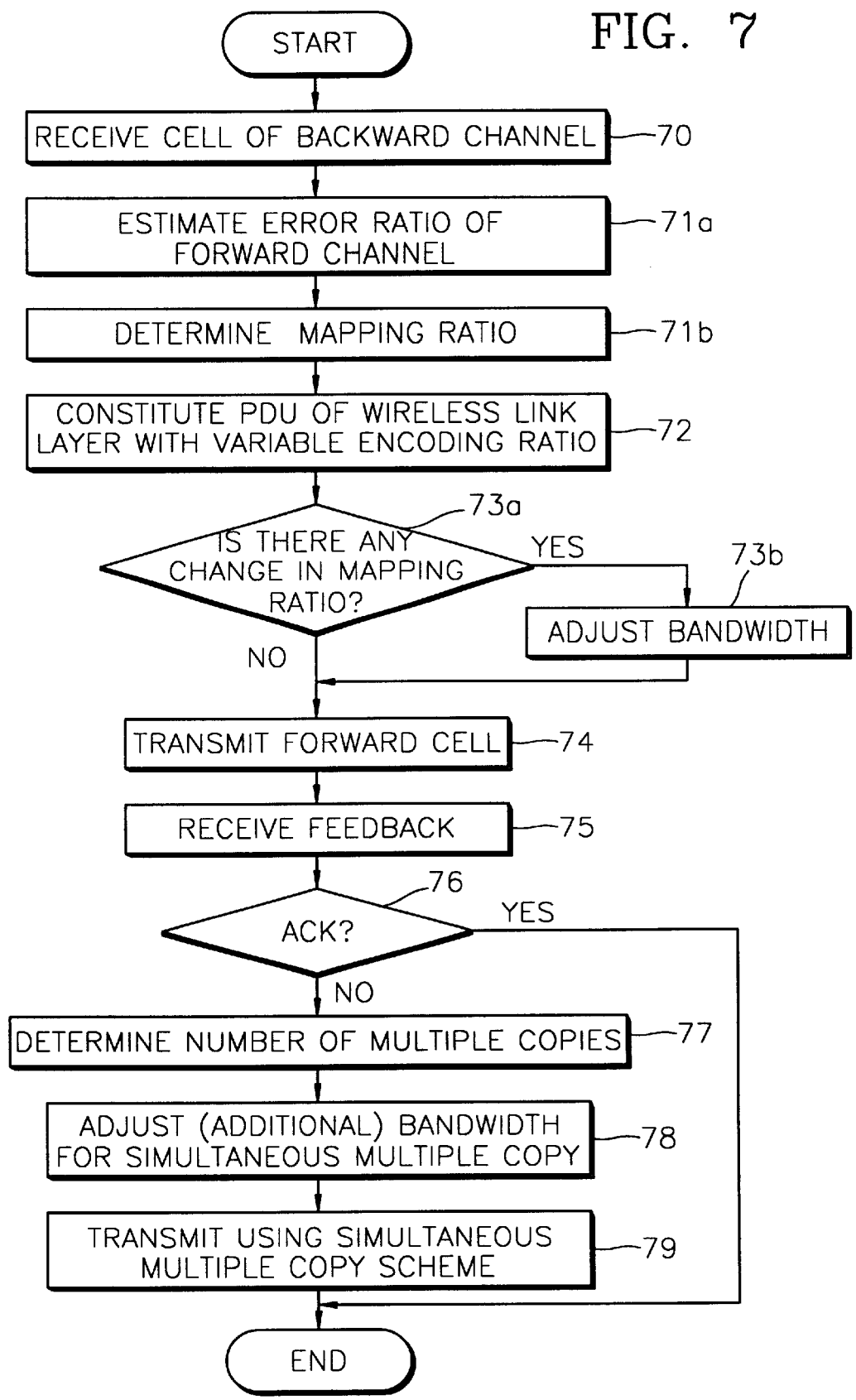
Figure 8:
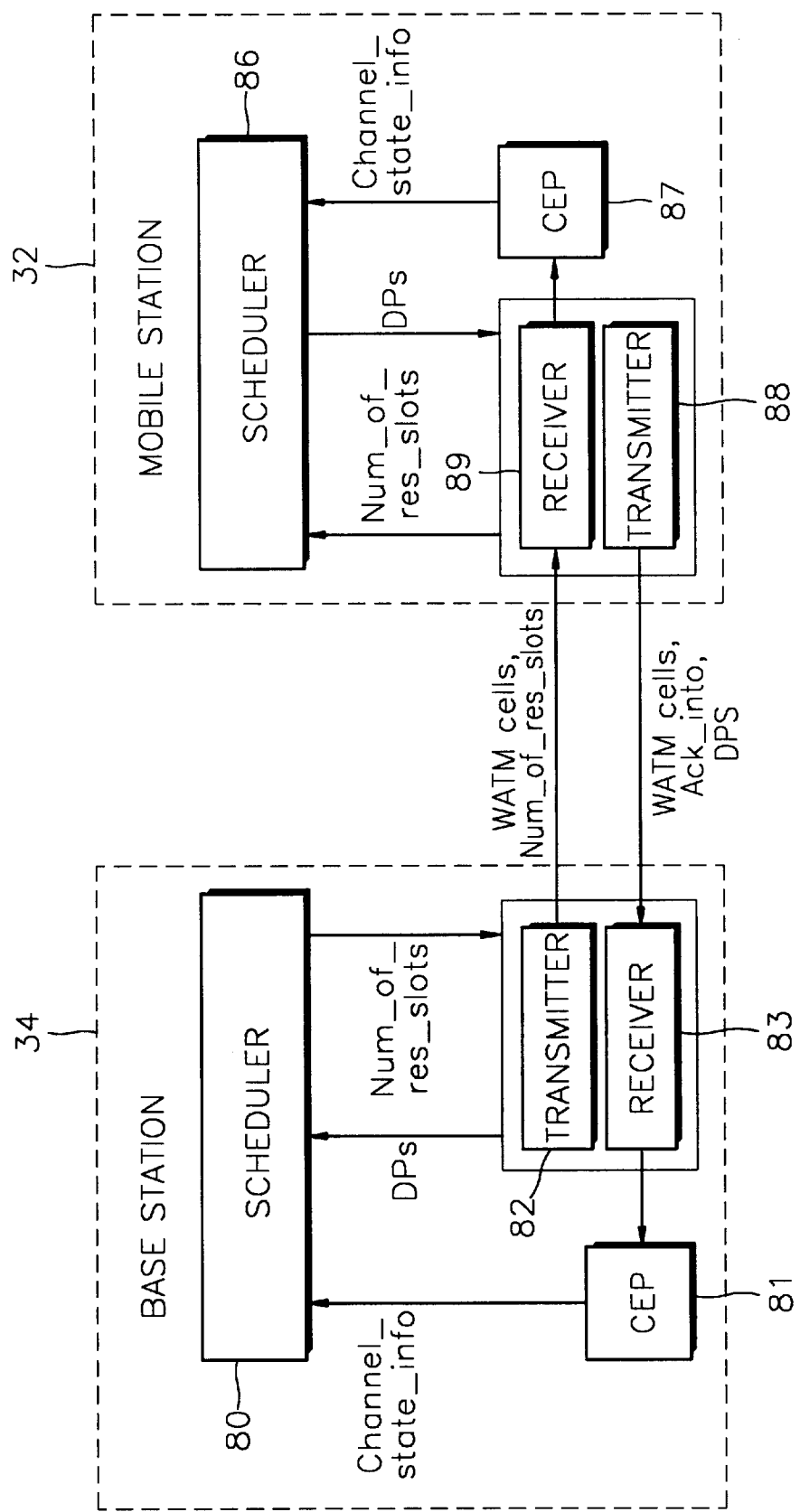

The above objects and advantages of the present invention will become more apparent by describing in detail a preferred embodiment thereof with reference to the attached drawings in which:

FIG. 1 schematically shows processes of controlling the error in a link layer by a conventional automatic repeat request (ARQ) scheme;

FIG. 2 schematically shows the structure of a protocol data unit (PDU) of a wireless link layer according to the conventional hybrid ARQ scheme;

FIG. 3 schematically shows the entire structure of a wideband wireless communication network according to an embodiment of the present invention;

FIG. 4 schematically shows the ARQ scheme using a simultaneous multiple copy scheme according to an embodiment of the present invention;

FIG. 5 schematically shows the structure of a PDU of a wireless link layer according to an embodiment of the present invention;

FIG. 6 schematically shows the structure of a PDU of a wireless link layer according to another embodiment of the present invention;

FIG. 7 is a flowchart showing a method for controlling the errors in a link layer in wireless wideband communication according to a preferred embodiment of the present invention;

FIG. 8 schematically shows a resource allocation and request mechanism between a base station and a mobile station.

DESCRIPTION OF THE PREFERRED EMBODIMENT(S)

FIG. 3 schematically shows the general structure of a wideband wireless communication network according to an embodiment of the present invention. FIG. 3 shows an asynchronous transfer mode (ATM) network as example, which is a representative wideband communication network. However, the present invention is not restricted to this.

As shown in FIG. 3, terminal devices 30 through 30$n$ and mobile stations 32 through 32$m$ are connected by a wire channel. An optical cable is generally used as the medium of the wire channel. ATM cells 31 through 31$n$, which are the transmission units in a link layer, have a fixed length of 53 bytes. The mobile stations 32 through 32$m$ and the base station 34 are connected by a wireless channel. The present invention relates to a method for controlling errors in the link layer with respect to wireless ATM cells 33 through 33$m$ or other wireless cells transmitted within a wireless channel section. The cell, which is transmitted by the terminal devices 30 through 30n and reaches the base station 34 via the mobile stations 32 through 32m, is converted into a wire ATM cell 35 and is transmitted to a final destination node through an ATM network 36. However, the present invention can be applied to direct communication between two nodes connected to each other by the wireless channel.

From the point of view of the wireless link layer between the mobile station 32 and the base station 34, the protocol data unit (PDU) of the upper layer in the embodiment shown in FIG. 3 is the wire ATM cell 35. It is assumed that the PDU of the upper layer is the ATM cell in the embodiments of the present invention which will be described hereinafter. However, the present invention is not restricted to this.

In a wideband wireless communication system including the wireless ATM, unlike in a general digital communication system, the cycle of one frame is longer than a round trip delay (RTD) in many cases although the cycle of one frame is several milliseconds (ms), which is relatively short, due to high speed data transmission rate. A transmitted cell can be fed back in one frame in such an environment. Therefore, the method for controlling errors in the link layer can be applied to a real time service. However, the present invention is not restricted to such an environment.

In the wireless channel whose state changes at any time and whose bit error ratio significantly varies unlike in the wire channel, it is basically difficult to provide an excellent QOS by one error controlling method. Therefore, an adaptive error controlling method which can adapt in accordance with the state of the channel is required.

It is necessary to estimate the state of the channel in order to use the adaptive error controlling method in accordance with the state of the channel. It is ideal that a cell receiver estimates the state of the channel and informs a transmitter of the state of the channel without errors. However, it is difficult to guarantee the reliability of feedback information in the wireless channel and it is difficult for the transmitter to rapidly react when the state of the channel fluctuates or high speed data is transmitted.

Therefore, in the embodiment of the present invention, a method, where the transmitter estimates the state of a forward (a direction from which the transmitter transmits a cell) channel through the state of a backward (a direction to which the transmitter receives a cell) channel, is used. Since each frame is classified into a forward part and a backward part in a time division multiple access/time division duplexing (TDMA/TDD) configuration, which is provided as the standard of the wireless ATM, it is possible to estimate the state of the forward channel through information on the backward channel. Considering the short length of the frame and high speed transmission ratio in the wideband wireless communication, it can be considered that the state of the channel rarely changes in one frame. A detailed method of estimating the channel will be described in FIG. 7.

In order to guarantee the optimal performance of the channel and to guarantee the minimum delay time, the number of re-transmission attempts must be reduced by increasing the probability of correcting forward errors by using more error controlling bits as the state of the channel becomes poorer, and waste of resources must be minimized by using less error controlling bits when the state of the channel becomes better. However, since the current ATM cell size is fixed, a scheme of segmenting the PDU of the upper layer and converging the segmented PDU to the PDU of a wireless data link control (DLC) layer (DLC-PDU) is used in order to use a number of error control bits which varies according to the error ratio of the channel. A detailed method of determining a convergence ratio (or a mapping rate) will be described later with reference to FIG. 7.

A method of constituting the wireless DLC-PDU when the mapping rates are 1:1 and 2:3 will now be described.

FIG. 5 schematically shows the structure of the PDU of the wireless link layer when the mapping ratio is 1:1, according to an embodiment of the present invention. Here, a wire ATM cell having a length of 53 bytes, which is the current standard, and the wireless DLC-PDU having a length of 64 bytes, which is provided as the standard of the wireless ATM cell, will be taken as examples.

In the present embodiment, a case where the mapping ratio is 1:1 means a normal operation mode state in which the error ratio of the wireless channel is equal to or less than a predetermined threshold value. In this case, a PDU 50 of one wire ATM cell is converged to one wireless DLC-PDU 55.

In the present embodiment, a header 51 and a payload 52 of the PDU 50 of the upper layer are separately converged to the wireless DLC-PDU 55 and cyclic redundancy code (CRC) encoding and forward error correction (FEC) encoding are performed on the header 51 and the payload 52. Namely, as shown in FIG. 5, when the mapping ratio is 1:1, the header 51 of the PDU 50 of the upper layer is converged to a header 51a of the wireless DLC-PDU 55, and a CRC 51b and an FEC 51c with respect to the header are added. The payload 52 of one PDU 50 of the upper layer is directly converged to a payload 52a of one wireless DLC-PDU 55, and a CRC 52b and an FEC 52c with respect to the payload are added.

Since the header 51 of the PDU 50 of the upper layer can be compressed by a simple method such as masking without using a complicated algorithm, it is preferable that the header 51 is compressed and is converged to the header 51a of the wireless DLC-PDU 55. Also, a DLC connection identification number required for transmission in a wireless section, information on segmentation and reassembly (SAR), and information on the sequence number of an automatic repeat request (ARQ) protocol, etc. can be included in the header 51a of the wireless DLC-PDU 55. A CRC 51b used for detecting the error in a wireless ATM cell header is generally constituted of 2 bytes.

In the present embodiment, the payload 52 of one PDU 50 of the upper layer is converged to a payload 52a of one wireless DLC-PDU 55 since the mapping ratio is 1:1. However, in other embodiments, the payload of the PDU of the upper layer is segmented into parts having a length which depends on the state of the channel, and the segmented parts of the payload are converged. The CRC 52b and FEC 52c of the payload encode only payloads.

In general, the CRC is encoded in order to determine whether errors occur in corresponding data, and the FEC is encoded so as to recover an original bit value by correcting the error within an appropriate bit error ratio range depending on the encoding rate. Therefore, in a hybrid ARQ method where the CRC and the FEC are used together, errors within a certain bit error ratio range are firstly corrected by the FEC and they are secondly checked by the CRC. Anyone skilled in the art will understand a detailed method of encoding the CRC and the FEC.

Since the header and the payload of a cell are each affected differently by errors, it is preferable that the header and the payload have different levels of error coping ability, respectively. Namely, FEC, which can strongly cope with errors, is preferably used for the header, and FEC having a weaker error correcting ability than that for the header is preferably applied to the payload.

It is preferable that error coping ability is improved by continuously changing the encoding ratio applied to the header and the payload of the cell in the wireless channel environment, where the state of the channel changes frequently. When the FEC encoding method having strong error correcting ability is used, the bandwidth efficiency of a channel deteriorates since an actual transmission amount of effective data is reduced as the length of an FEC code increases. However, the number of re-transmission attempts caused by the error in the cell can be reduced due to the strong error correcting ability. When the FEC encoding method having weak error correcting ability is used, the bandwidth efficiency is improved. However, the number of re-transmission attempts caused by the error in the cell may increase due to relatively weak error correcting ability. Therefore, it is preferable that an FEC encoding method having stronger error correcting ability is used when the state of the channel becomes poorer.

When the FEC encoding method having the strong error correcting ability is used when the state of the channel is good, the inefficiency caused by deterioration of the bandwidth efficiency outweighs the efficiency caused by reduction of the number of re-transmission attempts due to the error in the cell. Therefore, the performance of an entire system will deteriorate. In contrast, when an FEC encoding method having the weak error correcting ability is used when the state of the channel is poor, the inefficiency caused by the increase in the number of re-transmission attempts due to the error in the cell outweighs the increase in bandwidth efficiency. Accordingly, the performance of the entire system deteriorates and the average propagation delay time of a cell increases. Therefore, the optimal encoding ratio is an important factor which determines the performance of the system.

The structure of the wireless DLC-PDU according to the embodiment of the present invention in a case where the state of the channel is poor will now be described, taking as an example a case where the mapping ratio is 2:3. FIG. 6 schematically shows the structure of the PDU of the wireless link layer when the mapping ratio is 2:3 according to another embodiment of the present invention. In the embodiment of FIG. 6, it is assumed that the PDU of the upper layer is the wire ATM cell and that the length of the wireless DLC-PDU is standard 64 bytes. However, the present invention is not restricted to this.

As shown in FIG. 6, the header and the payload of a PDU 60 of the upper layer are separately converged to the header and the payload of a wireless DLC-PDU 68 when the mapping ratio is N:M (N and M are positive integers and N is smaller than M), as in the case where the mapping ratio is 2:3.

In the case of the header, headers 61 and 64 of the PDU 60 of the upper layer are compressed and converged to headers 61a and 64a of the wireless DLC-PDU, and CRCs 61b and 64b, and FECs 61c and 64c are added, as in the case where the mapping ratio is 1:1. Here, the compressed headers 61a and 64a and the CRCs 61b and 64b of the wireless DLC-PDU 68 are formed by a method similar to the method used for the case where the mapping ratio is 1:1. However, the FECs 61c and 64c of the headers are encoded by a method having stronger error correcting ability than the method used for the case where the mapping ratio is 1:1. This is because the FEC having the stronger encoding ratio is advantageous in the case where the state of the channel is poor. Therefore, the FECs 61c and 64c of the headers of the DLC-PDU 68 in FIG. 6 are longer than the FEC 51c of the header of the DLC-PDU in FIG. 5.

In the case of the payload, the payload of the PDU 60 of the upper layer is segmented into pieces and converged to the payload of the wireless DLC-PDU 68 unlike in the case where the mapping ratio is 1:1. FIG. 6 shows that 2/3 of the front end 62 of the first payload of the PDU 60 of the upper layer is converged to a first payload 62a of the wireless DLC-PDU 68, that 1/3 of the rear end 63 of the first payload of the PDU 60 of the upper layer and 1/3 of the front end 65 of the second payload are converged to second payloads 63a and 65a of the wireless DLC-PDU 68, and that 2/3 of the rear end 67 of the second payload is converged to a third payload 67a of the wireless DLC-PDU 68. CRCs 62b, 6365b, and 67b of the respective payloads are encoded by the same method as the method shown in FIG. 5. However, FECs 62c, 6365c, and 67c are encoded so as to have a stronger encoding ratio than in the case where the mapping ratio is 1:1. Therefore, the ratio of the length of the FECs 62c, 6365c, and 67c to the length of the payload of the DLC-PDU 68 in FIG. 6 is larger than the ratio of the length of the FEC 52c to the entire length of the payload of the DLC-PDU 55 in FIG. 5. An encoding ratio having weaker error correcting ability than the encoding ratio applied to the FECs 61c, 64c, and 66c of the header is applied to the FECs 62c, 6365c, and 67c of the payload.

According to the method described above, in the embodiment of the present invention, the additional length of the FEC, which increases for strong error correction, is compensated for by segmenting the payload of the upper layer and converging the segmented payloads to the wireless DLC-PDU. Therefor, in the present embodiment, in order to guarantee optimal performance and a minimum cell delay time, the length of the wireless DLC-PDU is maintained to be always uniform although variable encoding rates are used according to the state of the channel.

When the mapping ratio of N:M is applied as in the present invention, it is necessary to add new header sections 66a, 66b, and 66c to the wireless DLC-PDU 68. Namely, the headers 66a of the wireless DLC-PDU, whose number corresponds to the difference between N and M (1 in the example of FIG. 6), is newly formed to include information such as the mapping ratio and is combined with the corresponding payload 67a. In the present embodiment, the additional header 66a is located at the end. However, it is apparent to anyone skilled in the art that the newly formed additional header may be located at the start.

The structure of the DLC-PDU using encoding rates that vary according to the state of the channel has been described. A simultaneous multiple copy scheme will now be described.

FIG. 4 schematically shows the ARQ scheme using the simultaneous multiple copy scheme according to an embodiment of the present invention.

According to the conventional ARQ, when a transmitter receives a negative acknowledgment (NAK) with respect to a transmitted cell after a round trip delay (RTD), only one copy of the originally transmitted cell is re-transmitted. However, in the case of a real time service, when an error occurs in the re-transmitted cell, even though a corresponding cell is successfully received by a receiver at the end, the case in which the corresponding cell must be abandoned may occur because the allowed propagation delay time of each cell for the real time service is exceeded due to the lapse of the accumulated RTD.

Therefore, in order to reduce the probability of an error occurring again in the cell where the error once occurred, that is, in order to minimize the average propagation delay time, the multiple copy scheme of transmitting a plurality of copies is used. The method of performing the multiple copy scheme is classified into a method of sequentially re-transmitting each copy of a cell in continuous frames (a general multiple copy mode) without allocation of additional bandwidth, that is, maintaining the previously allocated bandwidth, and a method of additional bandwidth being allocated and simultaneously re-transmitting a plurality of copies in the same frame (a simultaneous multiple copy mode).

In the general multiple copy mode, it is possible to increase the throughput of resources and to reduce the average cell propagation delay time, using only a given amount of bandwidth, in the case of a non-real time service in which cell propagation delay is not restricted. However, when the length of a frame is long, there are limitations in providing the real time service by the general multiple copy scheme. This is because the general multiple copy mode has a problem in that the transmission of normally generated cells is additionally delayed since re-transmitting the cell in which the error has occurred in the ARQ scheme means delaying the transmission of the normally generated cells.

In particular, when the general multiple copy mode is used for the real-time service in the wireless channel in which the state of the channel is variable, a serious problem may be caused by stopping the transmission of newly generated cells in order to re-transmit the plurality of copies of the cell in which the error has occurred. Namely, the probability that the newly generated cells are abandoned by excessive cell propagation delay is higher than the probability that the cells are abandoned due to errors which occur during transmission, even when the state of the channel slightly deteriorates. Accordingly, the system may become unstable.

Therefore, it is required that the time delay additionally caused by performing re-transmission is dependent on the propagation delay of the channel and the number of re-transmission attempts, for protocol stability that is needed to support real time service. For this, a method of additional bandwidth being allocated and transmitting a plurality of multiple copy cells in the same frame when re-transmission is performed, is the simultaneous multiple copy mode. In the simultaneous multiple copy mode, newly generated cells do not undergo transmission delay caused by the re-transmission of error cells.

As a result, when the general multiple copy mode ARQ protocol suitable for the non-real time service is used for the real time service, various problems can be caused. Therefore, in the embodiment of the present invention, the simultaneous multiple copy mode is used. Namely, cell transmission delay conditions which are required for the real time service can be satisfied, and a cell loss ratio can be minimized by additional bandwidth being allocated for multiple copies of a cell and transmitting the multiple copies of the cell in one frame. The operation of the multiple copy mode will be described with reference to FIG. 4.

As shown in FIG. 1, the receiver 12 sends an ACK or NAK to the transmitter 10 with respect to each cell transmitted by the transmitter 10. However, in the simultaneous multiple copy mode, when the receiver 12 finds errors in received third and seventh cells 41 and 42 and feeds back NAKs corresponding to the corrupted cells to the transmitter 10, the transmitter 10 which received the NAK after the lapse of the RTD re-transmits a plurality of copies 41a, 41b, 42a, and 42b of the corresponding cells to the receiver 12 in the same frame. In order to re-transmit the plurality of copies in the same frame, additional bandwidth must be allocated, which will be described later with respect to FIG. 7.

FIG. 4 shows an example in which two copies are re-transmitted. However, the number of copies can vary according to the state of the channel and the kind of application. FIG. 4 shows that the receiver 12 successfully receives one 44 of the third cells 41a and 41b transmitted in the simultaneous multiple copy method and erroneously receives the other 43. In this case, FIG. 4 shows that the ACK is sent, which is observed with respect to one whole frame. To be specific, a NAK is sent with respect to the error cell 43 and an ACK is sent with respect to the successful cell 44 in one frame. When an ACK is sent with respect to at least one of the multiple transmitted cells, the transmitter 10 considers that the corresponding cell was successfully received. FIG. 4 shows that a receiver successfully receives the corresponding cells 45 and 46 with respect to the two copies 42a and 42b of the seventh cell.

The structure of the DLC-PDU according to the variable encoding ratio and the simultaneous multiple copy method, according to the embodiment of the present invention, have been described. A method for controlling errors in wideband wireless communication according to a preferred embodiment of the present invention using the structure of the DLC-PDU and the simultaneous multiple copy method will now be described.

FIG. 7 is a flowchart describing a method for controlling the errors in a link layer in wireless wideband communication according to the present invention.

In general, it is preferable that the type of error controlling scheme used depends on the kind of service in the error controlling protocol in the link layer. This is because the QOS to be satisfied significantly varies for different services, since the characteristics of the respective services are different from each other. The different kinds of services include a constant bit ratio (CBR) service such as voice, a real-time variable bit ratio (RT-VBR) service and a non real-time variable bit ratio (NRT-VBR) service such as a moving picture, and an available bit rate/unspecified bit ratio (ABR/UBR) service such as a data communication.

Therefore, it is preferable that different error controlling schemes are applied to the respective services in converging the service of each upper layer to the wireless DLC-PDU. In general, in the ATM, each service forms one session and each session forms a virtual circuit (VC) in each frame. Therefore, it is preferable that the error controlling method according to the present invention is performed in each VC base.

First and second nodes are set in order to describe the method for controlling the errors in the link layer and the error controlling method is described focusing on the first node. However, the embodiments of the present invention can also be applied to the second node.

A direction in which the cell is transmitted from the first node to the second node is referred to as a forward direction, and a direction in which the cell is transmitted from the second node to the first node is referred to as a backward direction. However, since the embodiments of the present invention can be symmetrically applied to the first and second nodes as mentioned above, an upward link in which a cell is transmitted from the mobile station 32 to the base station 34 as shown in FIG. 3 can be the forward direction or the backward direction in the present embodiment, which is apparent to anyone skilled in the art.

The present invention includes two main steps each comprised of several sub-steps. A first step (steps 70 through 74) includes estimating the error ratio of the forward channel through the state of the backward channel, constituting the DLC-PDU which includes a forward error correction (FEC) code having an encoding ratio which varies according to the estimated error rate and transmitting the DLC-PDU through the forward channel. A second step (steps 75 through 79) includes re-transmitting the plurality of copies of the corresponding cell in the same frame in the simultaneous multiple copy mode when a NAK is received with respect to the corresponding cell through the backward channel. Here, the DLC-PDU has an encoding ratio which varies according to the state of the channel, however, has a fixed length. The respective steps will now be described.

Processes of estimating the error ratio of the channel and determining a convergence ratio (or mapping rate) will now be described. The first node receives cells transmitted through the backward channel (step 70), checks whether errors exist in the received cells, and sends an ACK/NAK with respect to the corresponding cell to the second node. A channel estimation processor (CEP) (refer to FIG. 8), which exists in the first node (and in the second node, as a matter of course) and independently operates, calculates the ratio of NAKs among the cells received during a certain period (or the size of a window) and estimates the calculated ratio as the error ratio of the forward channel (step 71a). As mentioned above, it is possible to estimate the state of the forward channel through backward information in the TDMA/TDD-configuration.

The estimated forward channel error ratio is represented in Equation 1.

$$P_e(estimation) = \frac{N_{nak}}{T_w} = \frac{N_{nak}}{N_{ack} + N_{nak}} \quad (1)$$

Here, $P_e$(estimation) represents the estimated error ratio of the channel. $T_w$ represents the size of a window. $N_{ack}$ and $N_{nak}$ represent the number of times the ACK is transmitted during a corresponding window size and the number of times the NAK is transmitted during the corresponding window size, respectively.

A ratio in which the PDU of the upper layer is mapped to the PDU of the wireless link layer is determined on the basis of the error ratio estimated as shown in Equation 1 (step 71b).

When the estimated error ratio is less than a predetermined threshold value, namely, when the error ratio of the channel is very low, the ratio to which the PDU of the upper layer is converged to the wireless DLC-PDU is determined to be 1:1.

However, when the estimated error ratio is equal to or more than a predetermined threshold value (an FEC enhanced mode), it is necessary to improve the forward error correcting ability by using a stronger FEC. However, it is necessary to reduce the payload due to the increased length of the stronger FEC in order to maintain the length of the fixed DLC-PDU. In order to do this, the payload of the PDU of the upper layer is segmented and the segmented payloads are converged into the payload of the wireless DLC-PDU. For example, when the convergence ratio is determined to be 2:3, the payloads of the two PDUs of the upper layer are converged to the three DLC-PDUs of the wireless layer.

Namely, determining the mapping ratio to be N:M means that the payloads of the N PDUs of the upper layer are converged to the M DLC-PDUs of the wireless layer.

Therefore, in the case where the mapping ratio of the normal operation mode is 1:1, when the mapping ratio in the FEC enhanced mode is expressed as N:M (N and M are positive integers), N is always smaller than M. When the estimated error ratio becomes higher, a mapping ratio, where N/M is smaller, is used. For example, an FEC having stronger error correcting ability is used when the mapping ratio is 2:3 than when the mapping ratio is 3:4 (2/3 is smaller than 3/4).

In order to classify the FEC enhanced mode in detail, the estimated error ratio is divided into several sections and the mapping ratio in each section is determined. The N/M value of the mapping ratio is set to be smaller as the estimated error ratio becomes higher. Also, it is preferable that the mapping ratio is set so that M is N+1. This is because it is convenient to manage the additional header since the number of additional headers is one in such a case. However, it may be necessary to use more than one additional header.

A variable mapping ratio is determined according to the state of the channel. Accordingly, the encoding ratio of the FEC is varied depending on the state of the channel. However, the length of the DLC-PDU is fixed since the length for the increased part due to the strong FEC is secured by segmenting the PDU of the upper layer although the encoding ratio which is varied depending on the state of the channel is used.

The wireless DLC-PDU having the variable encoding ratio is formed according to the mapping ratio determined on the basis of the error ratio of the forward channel (step 72) and the wireless DLC-PDU is transmitted through the forward channel (step 74). The structures of the wireless DLC-PDUs according to the respective mapping rates were already described in FIGS. 4 and 5.

The state of the wireless channel according to the present invention is relatively variable. Namely, the state of the channel may deteriorate for short periods of time and may become normal. When the state of the channel changes with the lapse of time, the mapping ratio changes accordingly. Here, a case where the channel state is changed from a normal state to an FEC enhancing mode will now be described.

Let's assume that the mapping ratio is changed from 1:1, which is the mapping ratio of the normal channel state, to 2:3 since the state of the channel deteriorates. In such a case, three DLC-PDUs must be used in order to transmit the two PDUs of the upper layer. However, since only enough bandwidth for transmitting the two DLC-PDUs is allocated in the normal channel state, additional bandwidth must be allocated in order to operate in the FEC enhanced mode.

CEPs 81 and 87, which independently operate, are introduced to the base station 34 and the mobile station 32 as shown in FIG. 8 for resource allocation and request. The channel estimation processors (CEP) 81 and 87 provide the estimated channel state and the NAK information for supporting the simultaneous multiple copy mode shown in FIG. 4 to schedulers 80 and 86.

FIG. 8 schematically shows a resource allocation and request mechanism between the base station and the mobile station according to the embodiment of the present invention.

The CEP 87 for examining the cell received through a receiver 89 and estimating the state of the channel, exists in the mobile station 32. The CEP 87 provides information on the channel state (the mapping ratio and the NAK information) to the scheduler 86 which performs resource allocation and request in the mobile station 32. The scheduler 86 performs self scheduling for the necessary bandwidth, according to the information on the channel state and requests the necessary resources to the base station 34 through a transmitter 88 in the form of a dynamic parameter (DP). The CEP 81 for examining the cell received through a receiver 83 in the base station and estimating the state of the channel exists in the base station 34. The CEP 81 provides the information on the channel state to the scheduler 80 which performs resource allocation and request in the base station 34. Namely, the base station 34 and the mobile station 32 symmetrically operate, excluding the request and allocation of the resources. When the base station 34 is requested by the mobile station 32 to provide resources in the form of the DP, the scheduler 80 of the base station 34 performs the self-scheduling for bandwidth allocation and transmits a reserved slot to the mobile station 32 through a transmitter 82. Such operations of the CEP and the scheduler are performed in the case of the allocation of additional bandwidth for the simultaneous multiple copy mode shown in FIG. 4 as well as the allocation of the bandwidth due to the change in the mapping ratio.

The change in the mapping ratio will now be described with reference to FIG. 7. Whether the state of the channel changes is generally examined by the transmitter and the receiver by the CEP (step 73a). When the mapping ratio changes due to the change in the state of the channel, the bandwidth is adjusted (step 73b). The step 73b is performed as shown in FIG. 8.

FIG. 8 shows that the base station 34 allocates the bandwidth when the mobile station 32 requests the bandwidth allocation to the base station 34. However, since the state of the channel is estimated by the CEP 81 in the base station 34, a modified embodiment, in which the base station 34 automatically allocates additional bandwidth to the mobile station 32 when the state of the channel deteriorates, can be performed. Namely, since the base station 34 can control the allocation of the bandwidth by itself, the base station 34 can directly adjust the bandwidth to be allocated to the mobile station 32 when the upward channel state to the base station 34 deteriorates.

Although not shown in FIG. 7, the currently segmented PDUs of the upper layer are converged to the wireless DLC-PDUs based on the current method, and are transmitted even when the mapping ratio changes and the changed mapping ratio must be adopted after all the segmented PDUs are transmitted. For example, although the mapping ratio changes at the point of time where two wireless DLC-PDUs are currently transmitted in the state that the mapping ratio is 2:3, the remaining one DLC-PDU must be formed according to the current 2:3 mapping ratio and then, transmitted. If not, the consistency of each cell is not kept.

Feedback information on each cell transmitted through the forward channel is received (step 75). When the NAK is received, the number of copies to be re-transmitted with the simultaneous multiple copy mode is determined (steps 76 and 77). The number of multiple copies in the multiple copy mode can be previously determined. However, the variable number of multiple copies depending on the estimated state of the channel can be dynamically determined.

Since additional bandwidth is required for the simultaneous multiple copy, the bandwidth must be additionally adjusted (step 78). This step is performed by a method similar to that used for the step 74b of adjusting the bandwidth according to the change in the mapping rate. Namely, a method, in which the base station 34 allocates additional bandwidth when the mobile station 32 requests additional bandwidth allocation to the base station 34, and a method, in which the base station 34 which sent the NAK estimates that the mobile station 32 is transited to the simultaneous multiple copy mode and previously allocates additional bandwidth, can be used.

After adjusting the additional bandwidth for the simultaneous multiple copy, a plurality of copies of the cell with respect to which the NAK is received are transmitted in the same frame by the simultaneous multiple copy method (step 79). The simultaneous multiple copy method was described in FIG. 4.

The embodiment of the present invention, which includes the steps of forming the wireless DLC-PDU according to the variable encoding ratio based on the state of the channel and of re-transmitting the copies of the error cells with the simultaneous multiple copy method when the NAK is received, was described. However, it is apparent to anyone skilled in the art that an embodiment, in which only one of the above steps is adopted, can be performed. The basic ARQ mechanism, which was not mentioned, for example, a time-out mechanism, can be applied to the embodiments of the present invention.

The embodiments of the present invention can be realized by a program which can be executed by computer systems. Also, such a program can be executed by generally used digital computer systems by reading a corresponding program from computer readable recording media in which such a program is recorded. Magnetic storage media such as ROMs, floppy disks, and hard disks, optical reading media such as CD-ROMs, DVDs, and carrier waves such as transmission through the Internet are included in the computer readable recording media.

According to the present invention, it is possible to reduce the number of re-transmission attempts by improving the probability of correcting forward errors using more error controlling bits as the state of the channel becomes worse and to minimize the waste of resources using less error controlling bits as the state of the channel becomes better, to thus obtain optimal performance and guarantee minimum delay time.

Also, according to the present invention, it is possible to change the channel encoding ratio according to the state of each channel while the length of the wireless DLC-PDU is fixed by estimating the state of the forward channel using the statistical characteristic of the backward channel and to reduce the cell transmission error ratio and the cell transmission delay time by re-transmitting a plurality of copies of the corrupted cell, in the simultaneous multiple copy mode.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for controlling errors in a link layer in wideband wireless communication using an automatic repeat request (ARQ) scheme, in which a wideband wireless channel is used for communication between a first node and a second node, comprising the steps of:
   (a) estimating the error ratio of a forward (a direction in which a cell is transmitted from the first node to the second node) channel using the state of a backward (a direction in which a cell is transmitted from the second node to the first node) channel, and transmitting a cell, in which a forward error correction (FEC) code having an encoding ratio that varies depending on the estimated error ratio is included in a protocol data unit (PDU) of a wireless link layer, through the forward channel; and (b) re-transmitting a plurality of copies of a cell transmitted in the step (a), when feedback information that indicates that an error exists in the cell transmitted in the step (a) is received through the backward channel.

2. The method of claim 1, wherein the PDU of the wireless link layer in the step (a) has a fixed length regardless of the variable encoding ratio of the FEC code.

3. A method for controlling errors in a link layer in wideband wireless communication using an automatic repeat request (ARQ) scheme, in which a wideband wireless channel is used for communication between a first node and a second node, comprising the steps of:

(a) estimating the error ratio of a forward (a direction in which a cell is transmitted from the first node to the second node) channel using the state of a backward (a direction in which a cell is transmitted from the second node to the first node) channel, and transmitting a cell, in which a forward error correction (FEC) code having an encoding ratio that varies depending on the estimated error ratio is included in a protocol data unit (PDU) of a wireless link layer, through the forward channel; and (b) re-transmitting the copy of a cell transmitted in the step (a), when feedback information that indicates that an error exists in the cell transmitted in the step (a) is received through the backward channel, wherein, in the step (b), a plurality of copies of the cell to be transmitted in the step (a) are re-transmitted using a simultaneous multiple copy method in the same frame.

4. A method for controlling errors in a link layer in wideband wireless communication using an ARQ scheme, in which a wideband wireless channel is used for communication between a first node and a second node, comprising the steps of:

(a) estimating the error ratio of a forward (a direction in which a cell is transmitted from the first node to the second node) channel through the state of a backward (a direction in which a cell is transmitted from the second node to the first node) channel;

(b) determining a ratio in which the PDU of an upper layer is converged to the PDU of a wireless link layer on the basis of the error ratio of the forward channel estimated in the step (a);

(c) transmitting the cell of the PDU of the wireless link layer formed according to the convergence ratio determined in the step (b) through the forward channel; and (d) re-transmitting a plurality of copies of the cell transmitted in the step (c) when feedback information which indicates that an error exists in the cell transmitted in the step (c) is received through the backward channel.

5. The method of claim 4, wherein the PDU of the upper layer is the PDU of a wire ATM cell.

6. The method of claim 4, wherein the step (a) comprises the steps of:

(a1) receiving a cell through the backward channel;

(a2) determining whether an error exists in the cell received in the step (a1); and (a3) calculating the ratio of the number of cells determined to have errors in the step (a2) to the number of cells received in the step (a1) during a predetermined time period, and estimating the ratio as the error ratio of the forward channel.

7. The method of claim 4, wherein, in the step (b), the convergence ratio is determined to be 1:1 when the error ratio estimated in the step (a) is less than a predetermined threshold value and the convergence ratio is determined to be N:M when the error ratio estimated in the step (a) is equal to or more than the predetermined threshold value, where N and M are first and second positive integers and N is smaller than M, and the integers N and M are such that a ratio N:M is set to be smaller as the estimated error ratio becomes higher.

8. The method of claim 7, wherein, in the step (b), N is smaller than M by 1.

9. The method of claim 7, wherein, in the step (b), a second threshold value, which is larger than the predetermined threshold value, is further set when the error ratio estimated in the step (a) is equal to or more than the predetermined threshold value and, when the error ratio estimated in the step (a) is equal to or more than the second threshold value, the convergence ratio, i.e., N/M, is determined to be less than the convergence ratio when the error ratio is less than the second threshold value by N/M, in the step (b).

10. The method of claim 7, wherein, in the step (b), a plurality of additional threshold values, which are larger than the predetermined threshold value, are further set when the error ratio estimated in the step (a) is equal to or more than the predetermined threshold value and, when the error ratio estimated in the step (a) is equal to or more than a threshold value among the plurality of additional threshold values, the convergence ratio, i.e., N/M, is determined to be less than the convergence ratio when the error ratio is less than the threshold value.

11. A method for controlling errors in a link layer in wideband wireless communication using an ARQ scheme, in which a wideband wireless channel is used for communication between a first node and a second node, comprising the steps of:

(a) estimating the error ratio of a forward (a direction in which a cell is transmitted from the first node to the second node) channel through the state of a backward (a direction in which the cell is transmitted from the second node to the first node) channel and determining the ratio in which the payload of the PDU of an upper layer is converged to the payload of the PDU of a wireless link layer on the basis of the estimated error ratio;

(b) forming a cell to be transmitted through the forward channel by converging the header of the PDU of the upper layer to the header of the PDU of the wireless link layer, adding a first checksum and a first FEC code with respect to the header, converging the payload of the PDU of the upper layer to the payload of the PDU of the wireless link layer according to the convergence ratio determined in the step (a), and adding a second checksum and a second FEC code with respect to the payload;

(c) transmitting the cell formed in the step (b) through the forward channel; and (d) re-transmitting a plurality of copies of the cell transmitted in the step (c) when feedback information which indicates that an error exists in the cell transmitted in the step (c) is received through the backward channel.

12. The method of claim 11, wherein, in the step (b), information for a wireless link and information on the convergence ratio determined in the step (a) are added to the header of the PDU of the upper layer and the header of the PDU of the upper layer, to which the information for the wireless link and the information on the convergence ratio determined in the step (a) are added, is converged to the header of the PDU of the wireless link layer.

13. The method of claim 11, wherein, in the step (b), the header of the PDU of the upper layer is compressed and converged to the header of the PDU of the wireless link layer.

14. The method of claim 11, wherein, in the step (b), the FEC code with respect to the header is encoded in an encoding method having a higher correction ratio than the FEC code with respect to the payload.

15. The method of claim 11, wherein the PDU of the wireless link layer has a fixed length regardless of the convergence rate.

16. The method of claim 11, wherein, in the step (a), the convergence ratio is determined to be 1:1 when the estimated error ratio is less than a predetermined threshold value and the convergence ratio is determined to be N:M when the estimated error ratio is equal to or more than the predetermined threshold value, where N and M are first and second positive integers and N is smaller than M, and the integers N and M such that a ratio N:M is set to be smaller as the estimated error ratio becomes higher and wherein, in the step (b), when the convergence ratio is determined to be N:M in the step (a), the FEC codes with respect to the header and the payload are encoded in an encoding method having a higher error correction ratio as the ratio N:M becomes smaller.

17. The method of claim 11, wherein, in the step (a), when N and M are first and second positive integers and N is smaller than M, the convergence ratio is determined to be 1:1 when the estimated error ratio is less than a predetermined threshold value and the convergence ratio is determined to be N:M when the estimated error ratio is equal to or more than the predetermined threshold value, and wherein, in the step (b), when the convergence ratio is determined to be N:M in the step (a), each header of the PDUs of the upper layer is converged to each header of the PDUs of the wireless link layer, the N payloads of the PDUs of the upper layer are partitioned into the M payloads of the PDUs of the wireless link layer and converged, the headers of the PDUs of the wireless link layer corresponding to the difference between N and M is newly constituted including information on the convergence rate.

18. A method for controlling errors in a link layer in wideband wireless communication using an ARQ scheme, in which a wideband wireless channel is used for communication between a first node and a second node, comprising the steps of:

(a) partitioning an error ratio of the wideband wireless channel into a plurality of sections and estimating the error ratio of a forward (a direction in which a cell is transmitted from the first node to the second node) channel to belong to one of the plurality of predetermined sections through the state of a backward (a direction in which the cell is transmitted from the first node to the second node) channel;

(b) determining the convergence ratio in which the payload of the PDU of an upper layer is converged to the payload of the PDU of a wireless link layer on the basis of the error ratio of the forward channel estimated to belong to one of the plurality of sections in the step (a) and forming a cell according to the convergence ratio, to be transmitted through the forward channel;

(c) newly adjusting allocated bandwidth when the convergence ratio determined in the step (b) changes due to the change of the section to which the error ratio estimated in the step (a) belongs;

(d) transmitting the cell formed in the step (b) through the forward channel; and (e) re-transmitting the copy of the cell transmitted in the step (d) when feedback information which indicates that an error exists in the cell transmitted in the step (d) is received through the backward channel.

19. The method of claim 18, wherein, in the step (c), the bandwidth to be allocated to the first node is automatically adjusted by the second node according to the state of the forward channel.

20. The method of claim 18, wherein the step (c) comprises the steps of:

(c1) the first node requesting the second node to allocate adjusted bandwidth according to a change in the convergence ratio determined in the step (b); and (c2) the second node allocating adjusted bandwidth to the first node according to the request of the first node.

21. A method for controlling errors in a link layer in wideband wireless communication using an ARQ scheme, in which a wideband wireless channel is used for communication between a first node and a second node, comprising the steps of:

(a) estimating the error ratio of a forward (a direction in which a cell is transmitted from the first node to the second node) channel through the state of a backward (a direction in which the cell is transmitted from the second node to the first node) channel and determining the ratio in which the PDU of an upper layer is converged to the PDU of a wireless link layer on the basis of the estimated error ratio;

(b) transmitting the cell of the PDU of the wireless link layer formed according to the convergence ratio determined in the step (a) through the forward channel;

(c) receiving feedback information on the cell transmitted in the step (b) through the backward channel; and (d) re-transmitting a plurality of copies of the cell transmitted in the step (b) when feedback information that indicates that an error exists in the cell transmitted in the step (b) is received in the step (c).

22. The method of claim 21, wherein, in the step (d), a plurality of copies of the cell transmitted in the step (b) are re-transmitted in the same frame using a simultaneous multiple copy method.

23. The method of claim 22, wherein the step (d) comprises the steps of:

(d1) determining the number of copies to be re-transmitted when feedback information that indicates that an error exists in the cell transmitted in the step (b) is received in the step (c); and (d2) re-transmitting the copies of the cell transmitted in the step (b), the number of which is determined in the step (d1).

24. The method of claim 23, wherein, in the step (d1), the number of copies to be re-transmitted is determined according to the convergence ratio.

25. A method for controlling errors in a link layer in wideband wireless communication using an ARQ scheme, in which a wideband wireless channel is used for communication between a first node and a second node, comprising the steps of:

(a) estimating an error ratio of a forward (a direction in which a cell is transmitted from the first node to the second node) channel through the state of a backward (a direction in which a cell is transmitted from the second node to the first node) channel and determining the ratio in which the PDU of an upper layer is converged to the PDU of a wireless layer on the basis of the estimated error ratio;

(b) transmitting the cell of the PDU of the wireless link layer, which is formed according to the convergence ratio determined in the step (a) through the forward channel;

(c) receiving feedback information on the cell transmitted in the step (b) through the backward channel;

(d) newly adjusting additional bandwidth required for re-transmitting a plurality of copies of the cell transmitted in the step (b) in the same frame using a simultaneous multiple copy method when feedback information that indicates that an error exists in the cell transmitted in the step (b) is received in the step (c); and (e) re-transmitting a plurality of copies of the cell transmitted in the step (b) in the same frame using a simultaneous multiple copy method when the feedback information that indicates that an error exists in the cell transmitted in the step (b) is received in the step (c).

26. The method of claim 25, wherein, in the step (d), the second node automatically adjusts the bandwidth to be additionally allocated to the first node when the second node finds that an error exists in the cell transmitted in the step (b).

27. The method of claim 25, wherein the step (d) comprises the steps of:

(d1) the first node requesting the second node to allocate additionally adjusted bandwidth required for re-transmitting a plurality of copies of the cell transmitted in the step (b) in the same frame using a simultaneous multiple copy method; and (d2) the second node allocating the additionally adjusted bandwidth to the first node according to the request of the first node.

28. A method for controlling errors in a link layer in a wideband wireless communication using an ARQ scheme, in which a wideband wireless channel is used for communication between nodes, comprising the steps of:

(a) forming a cell by converging the PDU of an upper layer to the PDU of a wireless link layer;

(b) transmitting the cell constituted in the step (a);

(c) receiving feedback information on the cell transmitted in the step (b); and (d) re-transmitting a plurality of copies of the cell transmitted in the step (b) in the same frame using a simultaneous multiple copy method when feedback information that indicates that an error exists in the cell transmitted in the step (b) is received in the step (c).

29. The method of claim 28, wherein the step (d) comprises the steps of:

(d1) newly adjusting additional bandwidth required for re-transmitting the plurality of copies of the cell transmitted in the step (b) in the same frame using a simultaneous multiple copy method when feedback information that indicates that an error exists in the cell transmitted in the step (b) is received in the step (c); and (d2) re-transmitting the plurality of copies of the cell transmitted in the step (b) in the same frame using the simultaneous multiple copy method.

30. Computer readable recording media in which programs for executing the following steps by computers are recorded, in wideband wireless communication for controlling errors in a link layer using an ARQ scheme, in which a wideband wireless channel is used for communication between a first node and a second node;

(a) estimating an error ratio of a forward (a direction in which a cell is transmitted from the first node to the second node) channel through the state of a backward (a direction in which a cell is transmitted from the second node to the first node) channel and transmitting a cell, in which a FEC code having a variable encoding ratio according to the estimated error ratio is included in the PDU of a wireless link layer, through the forward channel; and (b) re-transmitting a plurality of copies of the cell transmitted in the step (a) when feedback information which indicates that an error exists in the cell transmitted in the step (a) is received through the backward channel.

31. Computer readable recording media in which programs for executing the following steps by computers are recorded, in wideband wireless communication for controlling errors in a link layer using an ARQ scheme, in which a wideband wireless channel is used for communication between a first node and a second node;

(a) estimating the error ratio of a forward (a direction in which a cell is transmitted from the second node to the first node) channel through the state of a backward (a direction in which a cell is transmitted from the second node to the first node) channel;

(b) determining a ratio to which the PDU of an upper layer is converged to the PDU of a wireless link layer, on the basis of the error ratio of the forward channel estimated in the step (a);

(c) forming a cell to be transmitted through the forward channel by converging the PDU of the upper layer to the PDU of the wireless link layer according to the convergence ratio determined in the step (b);

(d) transmitting the cell formed in the step (c) through the forward channel;

(e) receiving feedback information on the cell transmitted in the step (d) through the backward channel; and (f) re-transmitting a plurality of copies of the cell transmitted in the step (d) according to the ARQ scheme when feedback information that indicates that an error exists in the cell transmitted in the step (d) is received in the step (e).

32. The recording media of claim 31, wherein the step (a) comprises the steps of:

(a1) receiving a cell through the backward channel;

(a2) determining whether an error exists in the cell received in the step (a1); and (a3) calculating the ratio of the number of cells determined to have errors in the step (a2) to the plurality of cells received in the step (a1) during a predetermined time period and estimating the ratio to be the error ratio of the forward channel.

33. The recording media of claim 31, wherein, in the step (b), when N and M are first and second positive integers and N is smaller than M, the convergence ratio is determined to be 1:1 when the error ratio estimated in the step (a) is less than a predetermined threshold value and the convergence ratio is determined to be N:M when the error ratio is equal to or more than the predetermined threshold value.

34. The recording media of claim 31, wherein, in the step (c), the cell to be transmitted through the forward channel is formed by adding a first checksum and a first FEC code with respect to a header after compressing and then converging the header of the PDU of the upper layer to the header of the PDU of the wireless link layer and then adding a second checksum and a second FEC code with respect to a payload after converging the payload of the PDU of the upper layer to the payload of the PDU of the wireless link layer according to the convergence ratio determined in the step (b).

35. Computer readable recording media in which programs for executing the following steps by computers are recorded, in wideband wireless communication for controlling errors in a link layer using an ARQ scheme, in which a wideband wireless channel is used for communication between a first node and a second node;

(a) estimating the error ratio of a forward (a direction in which a cell is transmitted from the second node to the first node) channel through the state of a backward (a direction in which a cell is transmitted from the second node to the first node) channel;

(b) determining a ratio to which the PDU of an upper layer is converged to the PDU of a wireless link layer, on the basis of the error ratio of the forward channel estimated in the step (a);

(c) forming a cell to be transmitted through the forward channel by converging the PDU of the upper layer to the PDU of the wireless link layer according to the convergence ratio determined in the step (b);

(d) transmitting the cell formed in the step (c) through the forward channel;

(e) receiving feedback information on the cell transmitted in the step (d) through the backward channel; and (f) re-transmitting a plurality of copies of the cell transmitted in the step (d) according to the ARQ scheme when feedback information that indicates that an error exists in the cell transmitted in the step (d) is received in the step (e), wherein the step (c) further comprises a step (g) of newly adjusting allocated bandwidth when the convergence ratio determined in the step (b) is changed due to a change in the error ratio estimated in the step (a).

36. Computer readable recording media in which programs for executing the following steps by computers are recorded, in wideband wireless communication for controlling errors in a link layer using an ARQ scheme, in which a wideband wireless channel is used for communication between a first node and a second node;

(a) estimating the error ratio of a forward (a direction in which a cell is transmitted from the second node to the first node) channel through the state of a backward (a direction in which a cell is transmitted from the second node to the first node) channel;

(b) determining a ratio to which the PDU of an upper layer is converged to the PDU of a wireless link layer, on the basis of the error ratio of the forward channel estimated in the step (a);

(c) forming a cell to be transmitted through the forward channel by converging the PDU of the upper layer to the PDU of the wireless link layer according to the convergence ratio determined in the step (b);

(d) transmitting the cell formed in the step (c) through the forward channel;

(e) receiving feedback information on the cell transmitted in the step (d) through the backward channel; and (f) re-transmitting the copy of the cell transmitted in the step (d) according to the ARQ scheme when feedback information that indicates that an error exists in the cell transmitted in the step (d) is received in the step (e), wherein, the step (f) further includes, when the copy of the cell transmitted in the step (d) is re-transmitted, re-transmitting at least one other copy of the cell transmitted in the step (d), thereby re-transmitting a plurality of copies of the cell transmitted in the step (d), wherein the plurality of copies of the cell transmitted in the step (d) are re-transmitted in the same frame using a simultaneous multiple copy method when feedback information which indicates that an error exists in the cell transmitted in the step (d) is received in the step (e).

37. Computer readable recording media in which programs for executing the following steps by computers are recorded, in wideband wireless communication for controlling errors in a link layer using an ARQ scheme, in which a wideband wireless channel is used for communication between a first node and a second node;

(a) estimating the error ratio of a forward (a direction in which a cell is transmitted from the second node to the first node) channel through the state of a backward (a direction in which a cell is transmitted from the second node to the first node) channel;

(b) determining a ratio to which the PDU of an upper layer is converged to the PDU of a wireless link layer, on the basis of the error ratio of the forward channel estimated in the step (a);

(c) forming a cell to be transmitted through the forward channel by converging the PDU of the upper layer to the PDU of the wireless link layer according to the convergence ratio determined in the step (b);

(d) transmitting the cell formed in the step (c) through the forward channel;

(e) receiving feedback information on the cell transmitted in the step (d) through the backward channel; and (f) re-transmitting the copy of the cell transmitted in the step (d) according to the ARQ scheme when feedback information that indicates that an error exists in the cell transmitted in the step (d) is received in the step (e), wherein the step (f) further includes, when the copy of the cell transmitted in the step (d) is re-transmitted, re-transmitting at least one other copy of the cell transmitted in the step (d), thereby re-transmitting a plurality of copies of the cell transmitted in the step (d) and the step (f) comprises the steps of:

(f1) newly adjusting additional bandwidth required for re-transmitting the plurality of copies of the cell transmitted in the step (d) in the same frame using a simultaneous multiple copy method when feedback information which indicates that an error exists in the cell transmitted in the step (d) is received in the step (e); and (f2) re-transmitting the plurality of copies of the cell transmitted in the step (d) in the same frame using a simultaneous multiple copy method.

* * * * *